US009913395B2

(12) United States Patent
Milligan et al.

(10) Patent No.: US 9,913,395 B2
(45) Date of Patent: Mar. 6, 2018

(54) DATA STORAGE ENCLOSURE WITH LATCH FEATURE

(71) Applicant: Seagate Technology LLC, Cupertino, CA (US)

(72) Inventors: Gray Daniel Milligan, Golden, CO (US); Anthony John Pronozuk, Loveland, CO (US)

(73) Assignee: Seagate Technology LLC, Cupertino, CA (US)

( * ) Notice: Subject to any disclaimer, the term of this patent is extended or adjusted under 35 U.S.C. 154(b) by 35 days.

(21) Appl. No.: 14/561,345

(22) Filed: Dec. 5, 2014

(65) Prior Publication Data

US 2016/0165743 A1   Jun. 9, 2016

(51) Int. Cl.
*H05K 7/00* (2006.01)
*H05K 7/14* (2006.01)

(52) U.S. Cl.
CPC ......... *H05K 7/1489* (2013.01); *H05K 7/1409* (2013.01)

(58) Field of Classification Search
None
See application file for complete search history.

(56) References Cited

U.S. PATENT DOCUMENTS

| 4,744,006 | A | * | 5/1988 | Duffield | G06F 1/184 361/679.32 |
| 4,758,928 | A | * | 7/1988 | Wierec | H01R 13/645 211/41.17 |
| 5,121,295 | A | * | 6/1992 | Lam | G06F 1/184 360/137 |
| 5,218,760 | A | * | 6/1993 | Colton | G06F 1/183 29/845 |
| 5,277,615 | A | * | 1/1994 | Hastings | G06F 1/181 361/679.32 |
| 5,347,430 | A | * | 9/1994 | Curlee | G06F 1/184 174/363 |
| 5,430,607 | A | * | 7/1995 | Smith | G06F 1/1615 361/679.34 |
| 5,708,563 | A | * | 1/1998 | Cranston, III | G06F 1/184 361/679.6 |
| 5,831,525 | A | * | 11/1998 | Harvey | G06F 1/206 340/501 |
| 6,049,451 | A | * | 4/2000 | Schmitt | E05B 63/143 312/216 |
| 6,078,504 | A | * | 6/2000 | Miles | G06F 1/184 174/17 CT |
| 6,247,944 | B1 | * | 6/2001 | Bolognia | G06F 1/184 439/157 |
| 6,539,486 | B1 | * | 3/2003 | Rolls | G06F 1/18 713/323 |
| 6,862,173 | B1 | * | 3/2005 | Konshak | G06F 13/409 361/679.33 |
| 7,200,008 | B1 | * | 4/2007 | Bhugra | G11B 25/043 361/679.21 |

(Continued)

*Primary Examiner* — Courtney Smith
*Assistant Examiner* — Rashen E Morrison
(74) *Attorney, Agent, or Firm* — Hall Estill Attorneys at Law

(57) ABSTRACT

A data storage enclosure may house at least two data storage devices and consist of a first electrical connector and a latch feature. The first electrical connector may be aligned with a second electrical connector of a data storage rack. The latch feature can be configured to contact a frame of the data storage rack to prevent the first and second electrical connectors from contacting until a lever of the latch feature is activated.

20 Claims, 6 Drawing Sheets

(56) References Cited

U.S. PATENT DOCUMENTS

| | | | |
|---|---|---|---|
| 7,239,523 B1* | 7/2007 | Collins | H05K 7/1445 |
| | | | 361/752 |
| 7,782,686 B2 | 8/2010 | Kishimoto et al. | |
| 7,944,691 B1 | 5/2011 | Pounds | |
| 7,983,032 B2 | 7/2011 | Walker et al. | |
| 8,023,263 B2 | 9/2011 | Crippen et al. | |
| 8,238,091 B2 | 8/2012 | Chang et al. | |
| 8,508,929 B2 | 8/2013 | Anguiano-Wehde et al. | |
| 8,641,313 B1 | 2/2014 | Crippen et al. | |
| 8,654,525 B2 | 2/2014 | Bondurant et al. | |
| 8,737,057 B2* | 5/2014 | Terry | G06F 1/187 |
| | | | 361/679.33 |
| 8,799,935 B2* | 8/2014 | Jung | G11B 33/022 |
| | | | 361/679.33 |
| 2005/0122675 A1* | 6/2005 | Cheng | G06F 1/18 |
| | | | 361/679.39 |
| 2008/0239655 A1* | 10/2008 | Oyama | G11B 33/128 |
| | | | 361/679.37 |
| 2008/0239657 A1* | 10/2008 | Oyama | G06F 1/183 |
| | | | 361/679.37 |
| 2011/0043996 A1* | 2/2011 | Chen | G06F 1/187 |
| | | | 361/679.58 |
| 2011/0176271 A1* | 7/2011 | Zhang | G06F 1/20 |
| | | | 361/679.33 |
| 2012/0026674 A1* | 2/2012 | Aldridge | G06F 1/187 |
| | | | 361/679.33 |
| 2013/0087518 A1 | 4/2013 | He | |
| 2013/0208413 A1* | 8/2013 | Huang | G06F 1/183 |
| | | | 361/679.31 |

\* cited by examiner

DATA STORAGE ENCLOSURE WITH LATCH FEATURE

SUMMARY

A data storage enclosure, in various embodiments, houses at least two data storage devices and consists of a first electrical connector and a latch feature. The first electrical connector may be aligned with a second electrical connector of a data storage rack. The latch feature can be configured to contact a frame of the data storage rack to prevent the first and second electrical connectors from contacting until a lever of the latch feature is activated.

DETAILED DESCRIPTION

With increasing amounts of data being generated and transferred among mobile and stationary computing devices, the capacity and data access speed of data storage devices has been stressed. The advent of remote computing capabilities, such as cloud computing, has further stressed data storage capacity, as large amounts of data are stored in a single location. Although multiple data storage devices can be incorporated into a collective data storage system to provide increased data storage capacity, such data storage systems can correspond with frequent maintenance that can impair and damage the performance of the data storage system. Hence, data storage systems with structure optimized for frequent equipment installation and removal is a continued goal of the data storage industry.

In accordance with various embodiments, a data storage enclosure can house at least two data storage devices and consist of a first electrical connector and a latch feature, with the first electrical connector aligned with a second electrical connector of a data storage rack, but prevented from contacting the second electrical connector due to latch feature contact with a frame of a data storage rack. The first and second electrical connectors can subsequently form secure electrical contact when the lever of the latch feature is rotated to a closed position. The ability to reliably prevent physical contact between the first and second electrical connectors can mitigate damage caused by connector misalignment and forceful installation of the data storage enclosure in the data storage rack.

Figure 1:
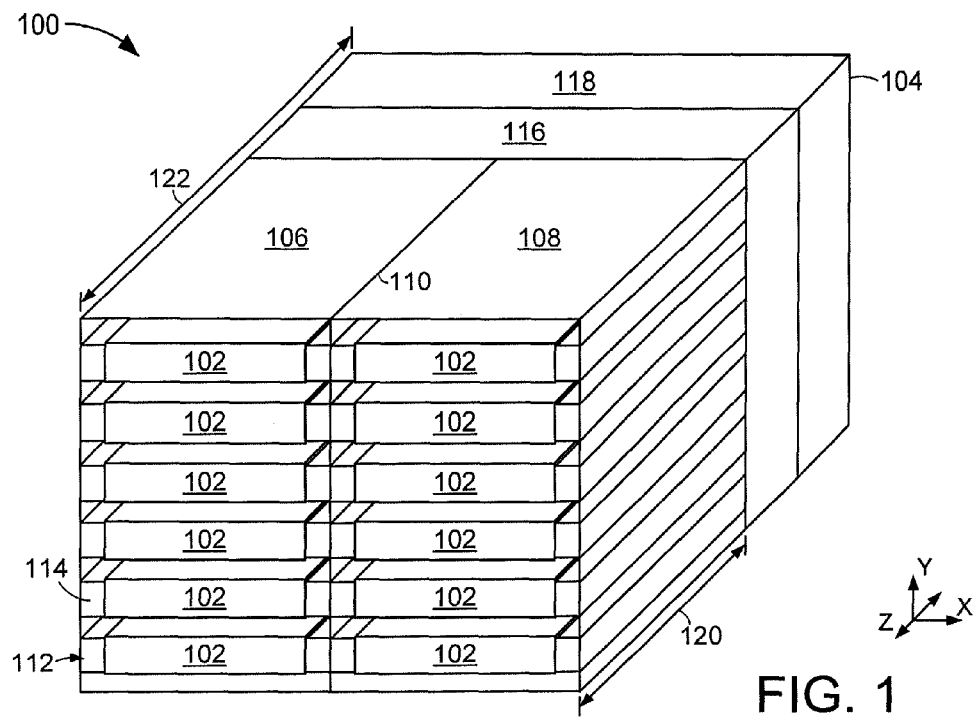
FIG. 1 is an isometric block representation of an example data storage system constructed and operated in accordance with various embodiments.

While a latch feature may be employed in an unlimited variety of mechanically engaged systems, various embodiments utilize a latch feature in the system 100, as shown as an isometric block representation in FIG. 1. The system 100 may comprise any number of electronic devices, such as data storage devices, servers, and circuits that operate independently and concurrently. The system 100 is configured with a plurality of enclosures 102 that can house one or more electronic devices. Each enclosure 102 can, in some embodiments, consist of a power source, local processor, and cooling assembly. An enclosure 102 can be configured to operate independently and concurrently with other enclosures housed in the rack 104.

The rack 104 may be arranged in any number of configurations, such as being separated into first 106 and second 108 compartments that are bifurcated by a wall 110. Each compartment 104 and 106 can be further arranged into separate trays 112 which may, or may not, correspond to the size and shape of an enclosure 102 and be aligned along a common plane, such as the X axis. Each tray 112 can be defined by, but is not limited by, a pair of rails 114 that support the enclosure 102 and allow the enclosure 102 to be installed and removed efficiently. For example, the rails 114 can be static protrusions, casters, slides, and ball bearings that retain the enclosure 102 while allowing enclosure 102 movement.

In some embodiments, the rack 104 contacts a midplane 116 that is disposed between a cooling section 118 and each compartment 104 and 106. The cooling section 118 may consist of any number of passive and active cooling components, such as fans, heat fins, and liquid pumps, which can operate to reduce, control, and maintain various temperatures for the data storage system 100. The midplane 116 can be arranged as any number, type, and size of connectors that operably interconnect the various enclosures 102. That is, the midplane 116 can be configured to physically and electrically interconnect the enclosures 102 and trays 112 to allow individual and concurrent data flow to and from the various enclosures 102. The midplane 116, in some embodiments, is configured to efficiently pass air, fluid, and cabling from the cooling section 118 to the respective compartments 104 and 106.

It is noted that, in some embodiments, the rack 104 can be configured in any variety of manners to temporarily and permanently store data. The non-limiting embodiment shown in FIG. 1 illustrates how the data storage enclosures 102 and compartments 104 and 106 can have a length 120 along the Z-axis that occupies a majority of the overall length 122 of the rack 104. However, assorted embodiments may tune the size of the enclosure length 120 to allow for a larger cooling section 118 and/or midplane 116. Regardless of the size of the enclosure length 120, the vertical stacking of multiple trays 112 and electronic devices allow for the rack 104 to have a large operating capacity, such as 1 petabyte of data storage.

Figure 2:
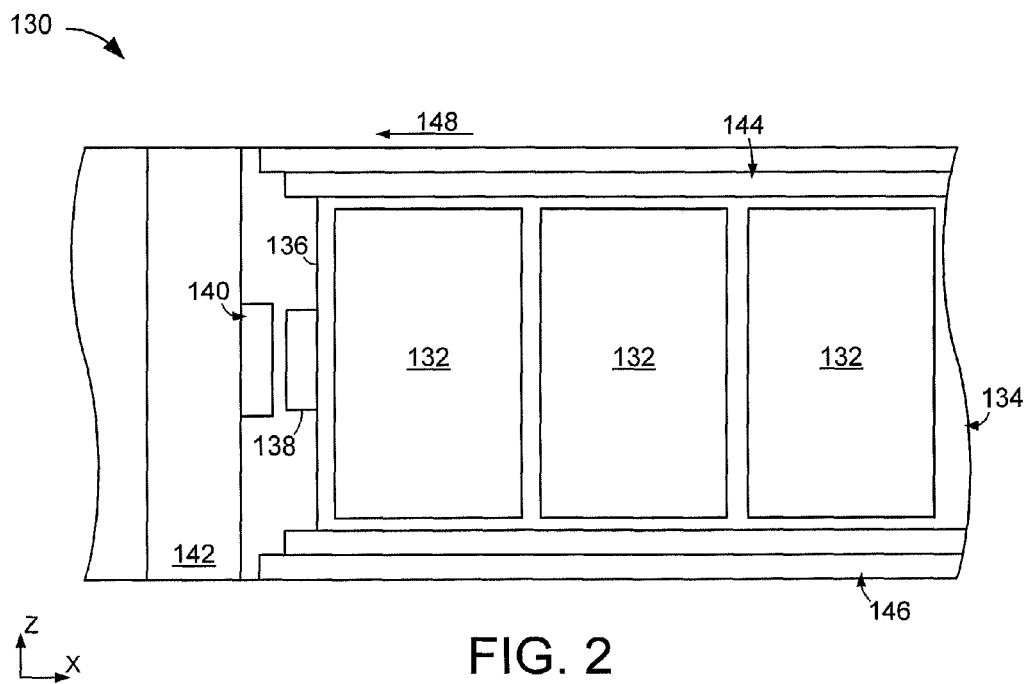
FIG. 2 shows a top view block representation of a portion of an example data storage enclosure configured in accordance with some embodiments.

FIG. 2 illustrates a side view block representation of a portion of an example data storage system 130 configured in accordance with some embodiments to incorporate a plurality of data storage devices 132 in a data storage enclosure 134. The data storage devices 132 may have similar or dissimilar physical sizes, data capacities, data access speeds, and memory types. For example, the data storage enclosure may have two rotating hard disk drives along with a solid-state memory array that are configured with different data capacities and, data programming speeds, and data read speeds. The data storage devices 132 can be arranged in any number of orientations along one, or multiple planes while being contained within the bounds of an enclosure frame 136.

The data storage devices 132 may be electrically connected in series, parallel, or individually to an enclosure bus 138 that is configured to mate with a midplane bus 140 to form a secure electrical connection. While it is contemplated that the various data storage devices 132 can be permanently connected to the midplane 142, such as a through a PCB, various embodiments configure the enclosure bus 138 and midplane bus 140 to allow selective electrical engagement between the data storage devices 132 and the midplane 142. The selective electrical engagement may be facilitated by sliding engagement of an enclosure track 144 with a rack track 146, which can be an unlimited variety of static and dynamic connections, such as springs, ball bearings, rollers, and protrusions, that align the data storage enclosure 134 along a plane in the X axis to align the enclosure 138 and midplane 140 buses.

Although the tuned configuration of the tracks 144 and 146 can efficiently allow the data storage enclosure 134 to be installed and removed from the data storage system 130, any number of situations can stress and damage the electrical connection between the enclosure 138 and midplane 140 buses. For instance, excessive force or vibration along direction 148 can inflict trauma on the buses 138 and 140 that may degrade and eliminate the ability to reliably interconnect the data storage devices 132 with the midplane 142. With increasing instances of data storage enclosure 134 manipulation for maintenance on the data storage devices 132, the ability to reliably and repeatedly interconnect the buses 138 and 140 without damaging the performance of the data storage system 130 is a consumer and industry goal.

Figure 3:
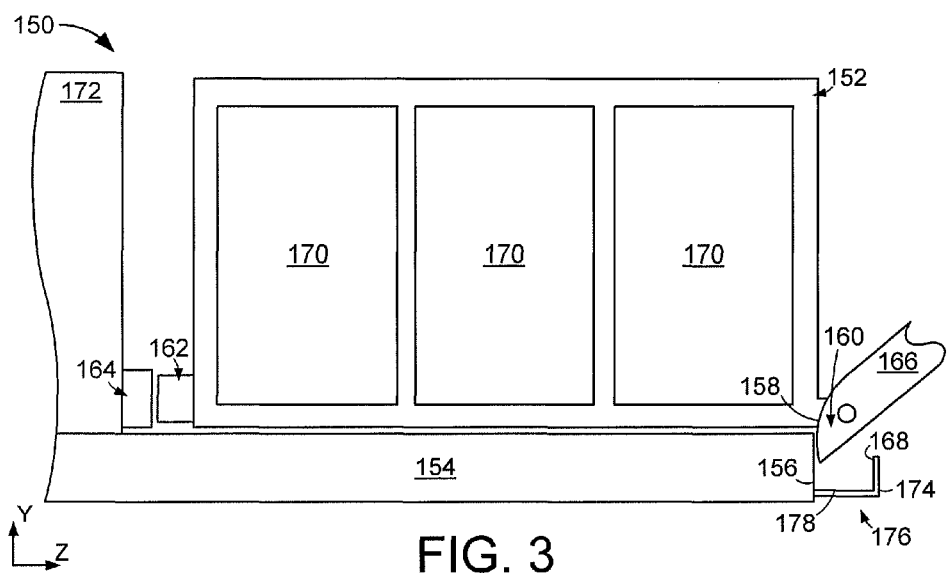
FIG. 3 conveys a side view block representation of a portion of an example data storage system constructed and operated in accordance various embodiments.

FIG. 3 displays a side view block representation of a portion of an example data storage system 150 constructed and operated in accordance with assorted embodiments to mitigate trauma during the installation and removal of a data storage enclosure 152 from a rack 154. The rack 154 may be arranged in an unlimited variety of manners to support some, or all, of the data storage enclosure 152 while providing a strike surface 156 that contacts a cam surface 158 of a stop feature 160 to prevent physical contact between an enclosure bus 162 and a midplane bus 164. The stop feature 160 can be tuned for size, shape, and material to provide efficient installation of the data storage enclosure 152 and alignment of the buses 162 and 164 while restricting contact between the buses 162 and 164 until a lever 166 is rotated.

That is, the data storage enclosure 152 can be removed and installed without concern for damaging the buses 162 and 164 due to the stop feature 160 providing a positive stop through contact of the strike 156 and cam 158 surfaces. Rotation of the lever 166 can subsequently translate the lever 166 in relation to a secondary strike surface 168 to initiate and secure physical and electrical contact between the data storage devices 170 of the data storage enclosure 152 and the midplane 172. The stop feature 160 may further be configured to physically secure the data storage enclosure's 152 position in the rack frame 154 by engaging a protrusion 174 of a retention feature 176.

As shown, the protrusion 174 can be tuned for shape and size to provide two retention surfaces 178 angled in a predetermined relationship, such as 45° or 90°. The tuned configuration of the protrusion 174 allows the retention feature 176 to capture the stop feature 160 and mitigate inadvertent data enclosure 152 movement, such as vibration, vertical movement along the Y axis, and lateral movement along the X axis. The ability to secure the stop feature 160 into the retention feature 176 allows the data storage enclosure 152 to be reliably retained in the rack 154 and selectively removed from the rack 154 through manipulation of the lever 166 and stop feature 160.

Figure 4:
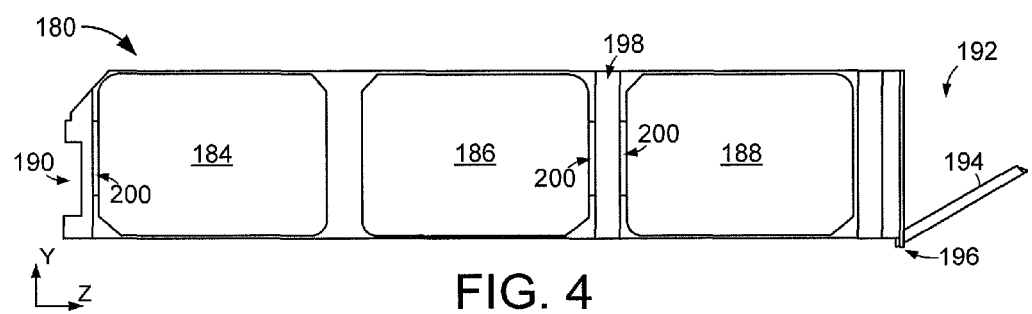
FIG. 4 displays a side view block representation of an example data storage enclosure configured in accordance with some embodiments.

FIG. 4 depicts a side view block representation of an example data storage enclosure 180 configured in accordance with some embodiments. The data storage enclosure 180 has a frame 182 that houses first 184, second 186, and third 188 data storage devices between an alignment feature 190 and a latch assembly 192. The latch assembly 192 can be arranged to provide a hinged lever 194 that manipulates a cam protrusion 196 to allow the connection feature 190 to engage a corresponding portion of a data storage rack, such as a midplane, with physical and electrical connections.

Various embodiments configure the data storage devices to minimize the complexity of the data storage enclosure 180 by orienting at least one data storage device in a different position than the other data storage devices. In the non-limiting example of FIG. 4, the second data storage device 186 is facing an opposite direction than the first 184 and third 188 data storage devices, which allows the second 186 and third 188 data storage devices to be connected to a common device bus 198 via electrical interconnects 200. An electrical interconnect 200 may also be used to connect the first data storage device 184 to another electrical bus or directly to the alignment feature 190. Through the tuned orientation of the data storage devices and the incorporation of the connection feature 190 and latch assembly 192, the data storage enclosure 180 can provide greater data storage capacity due to more densely packaged data storage devices and less electrical interconnection compared to data storage enclosures where each data storage device is connected to an electrical bus.

Figure 5A:
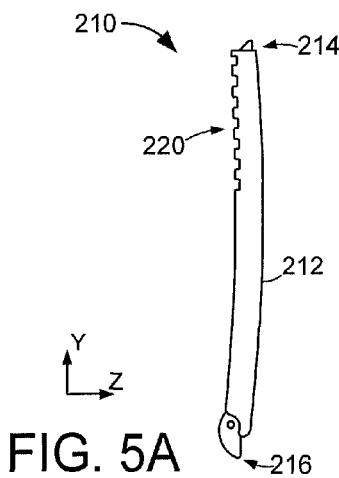
FIGS. 5A and 5B respectively show different views of a portion of an example latch feature configured in accordance with various embodiments.
Figure 5B:
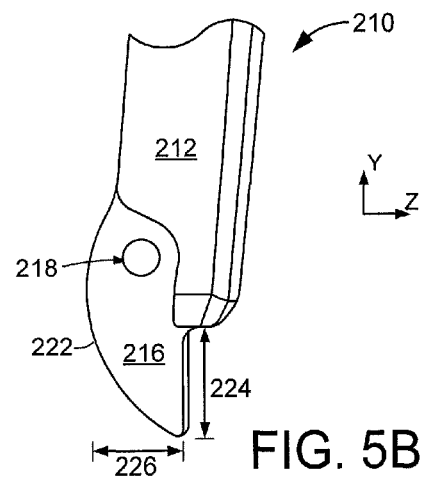

FIGS. 5A and 5B respectively show different views of a portion of an example latch feature 210 configured in accordance with some embodiments to mitigate data storage enclosure trauma during installation and secure electrical interconnection upon manipulation of the latch feature 210. The latch feature 210 has an elongated lever 212 that has a securing feature 214 on one end and a cam feature 216 on the opposite end. As shown in FIG. 5A, a hinge 218 can be positioned proximal the cam feature 216 to allow the lever 212 to rotate and manipulate the cam feature 216 in relation to a rack, such as rack 154 of FIG. 3. The lever 212 may also have one or more recesses 220 that can be configured to be a pattern to increase the functional aspects of the latch feature 210, such as the ergonomics of the lever 212.

FIG. 5B illustrates a side view of the cam feature 216 that shows how a continuously curvilinear cam surface 222 can extend about the hinge 218. It should be noted that the shape, size, material, and orientation of the cam surface 222 can be individually and collectively tuned to control the movement and electrical connection between a data storage enclosure and a midplane of a data storage rack. That is, the cam feature 216 can continuously extend a tuned length 224 and width 226 from the lever 212 to regulate how an attached data storage enclosure contacts a rack frame and moves in response to manipulation of the lever 212 about the hinge 218. It should be noted that the hinge 218 and securing feature 214 may be force assisted through the incorporation of one or more springs and solenoids.

Figure 6:
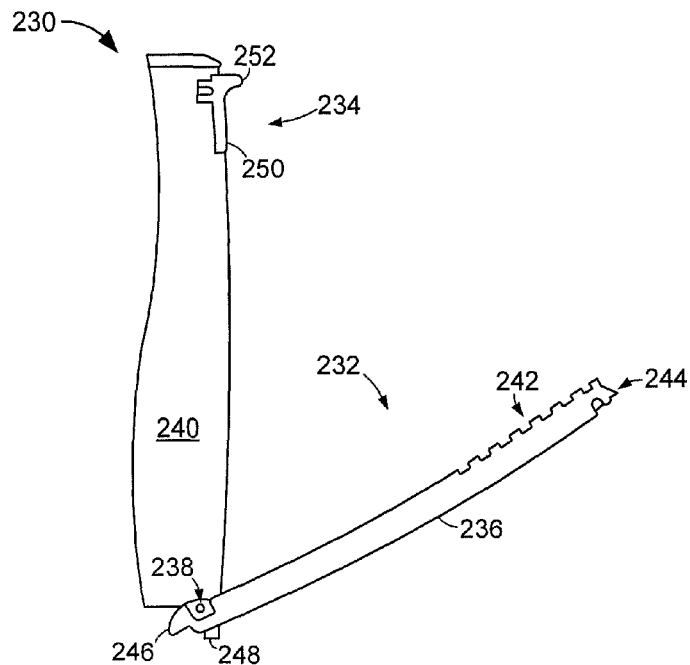
FIG. 6 is a side view block representation of an example latch feature arranged in accordance with some embodiments.

FIG. 6 displays a cross-sectional block representation of a portion of an example data storage enclosure 230 arranged in accordance with various embodiments to provide lever 232 and securing 234 features. As shown, the lever feature 232 has an elongated lever 236 that is hinged about a pivot point 238 of a data enclosure frame 240. The lever 236 has a pattern of recesses 242 proximal a retention tab 244 and opposite the pivot point 238 from a cam protrusion 246. It is contemplated that the retention tab 244 is rigid, but such construction is not required or limiting as a flexible or articulable tab protrusion can be utilized in some embodiments.

The pivot point 238 can be positioned on a lever protrusion 248 of the enclosure frame 240 to allow the cam protrusion 246 to extend below the enclosure body and engage a strike surface without forcing the enclosure frame 240 upwards along the Y axis. The securing feature 234 has a button 250 that is shaped with a dexterity protrusion 252 to allow selective manipulation of the button 250. Assorted embodiments configure the securing feature 234 to apply force on at least the retention tab 244 to secure the lever 236 and lever feature 232 in an installed position. That is, the lever 236 can be free to rotate about the pivot point 238 until the retention tab 244 engages the button 250 and the lever feature 232 becomes locked in an installed position.

FIGS. 7A-7D respectively illustrate a side view block representation of a portion of a data storage system 260 arranged and operated in accordance with various embodiments to install a data storage enclosure 262 into a data storage rack 264. It is noted that the assorted structure and function of the data storage system 260 shown in FIGS. 7A-7D can be carried out in part and in whole to remove, perform maintenance on, and install the data storage enclosure 262. The size, type, and configuration of the data storage rack 264 is not limited, but some embodiments configure it to house a multitude of separate data storage enclosures that are interconnected physically and electrically to provide a large data capacity, such as 1 Petabyte.

Figure 7A:
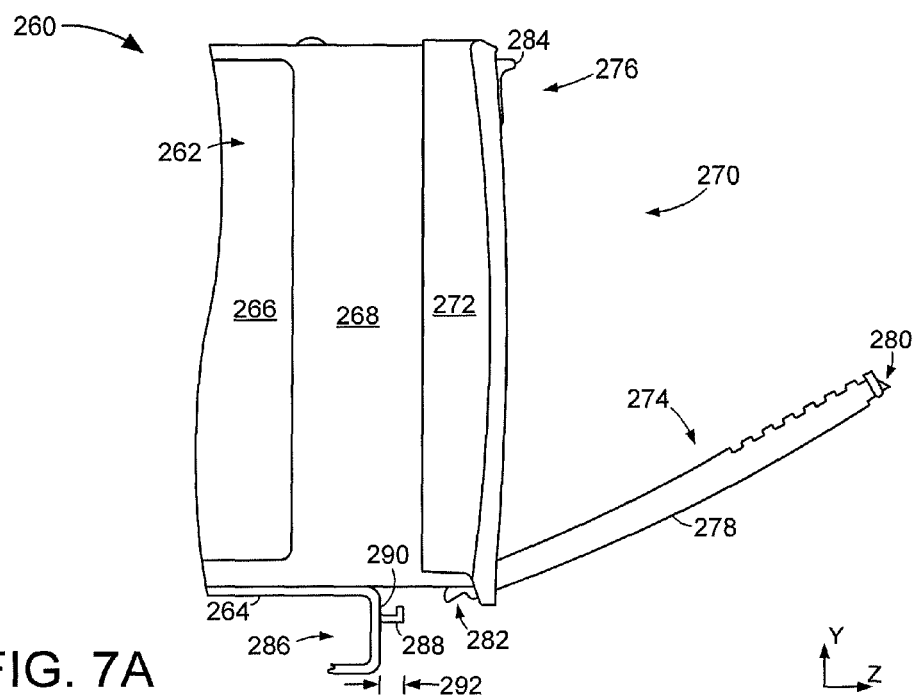
FIGS. 7A-7D respectively show side views of a portion of an example data storage enclosure configured in accordance with assorted embodiments.

In FIG. 7A, the data storage enclosure 262 has a data storage device 266 that is mounted on and housed within an enclosure frame 268. A lever assembly 270 has a body 272 that supports lever 274 and securing 276 features. The lever feature 274 has a hinged lever 276 that may be curvilinear, linear, or a combination thereof to provide a retention tab 280 on a first end and a cam protrusion 282 on an opposite end. The securing feature 276 consists of a button 284 that can secure and disengage the retention tab 280 in a vertical, installed position upon selection.

The data storage rack 264 is shaped to provide a retention feature 286 that has at least one retention protrusion 288 extending from a vertically oriented strike surface 290. Although the shape, size, position, orientation, and material of the retention feature 286 is not limited to a particular design, various embodiments configure the protrusion 288 with a offset position along the Y axis and a length 292 along the Z axis that allows the cam protrusion 282 to engage the strike surface 290 before contacting the retention protrusion 288. It is understood that the position of the lever 278 can dictate the manner in which the cam protrusion 282 engages the retention feature 286.

Figure 7B:
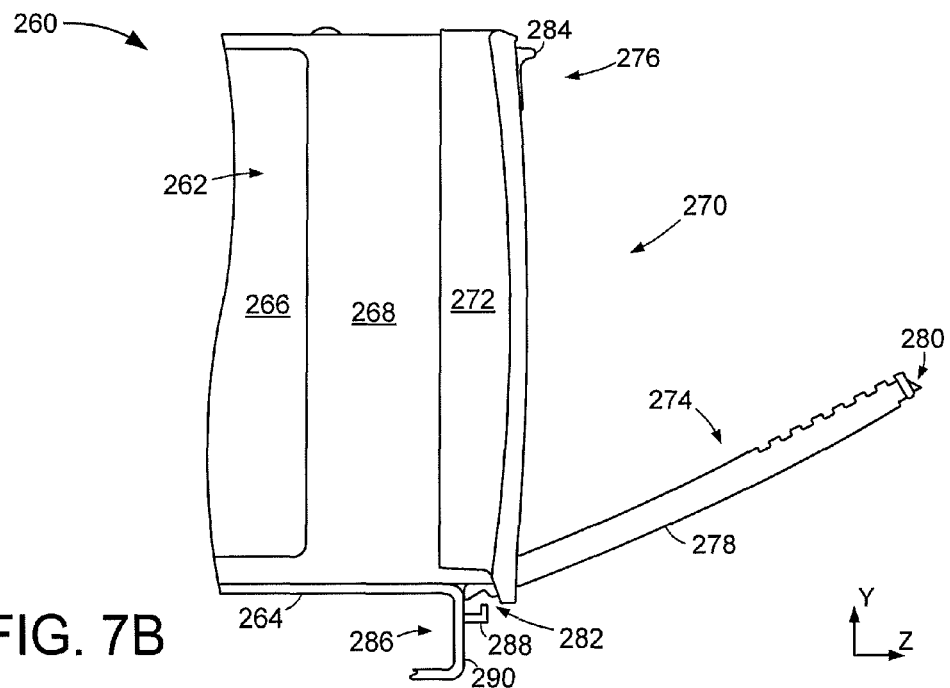

For the purposes of narrating FIGS. 7A-7D, and in no way limiting to the potential embodiments of the present disclosure, the lever 278 position shown in FIG. 7A will be considered a strike position that corresponds with the cam protrusion 282 positioned to contact the strike surface 290 before contacting the retention protrusion 288 when the data storage enclosure 262 is translated along the Z axis, as shown in FIG. 7B. In some embodiments, the cam protrusion 282 is tuned with a shaped cam surface that maintains the lever's 278 position upon contact with the strike surface 290 while other embodiments shape the cam protrusion 282 to automatically induce rotation of the lever 278 upon contact with the strike surface 290. The tuned shape and size of the cam protrusion 282 can make installation of the data storage enclosure 262 easier as excessive force is mitigated.

Regardless of how the cam protrusion 282 reacts to contact with the strike surface 290, the length of the cam protrusion 282 is tuned to ensure any electrical buses, connectors, and pins of the data storage enclosure 262 are prevented from contacting a corresponding electrical receptacle of the data storage rack 264. Such positive stop provided by contact of the cam protrusion 282 and the strike surface 290 allows a user to slidingly install the data storage enclosure 262 into the rack 264 without concern for damaging the data storage enclosure 262 or constituent electrical connections and data storage devices 266.

Figure 7C:
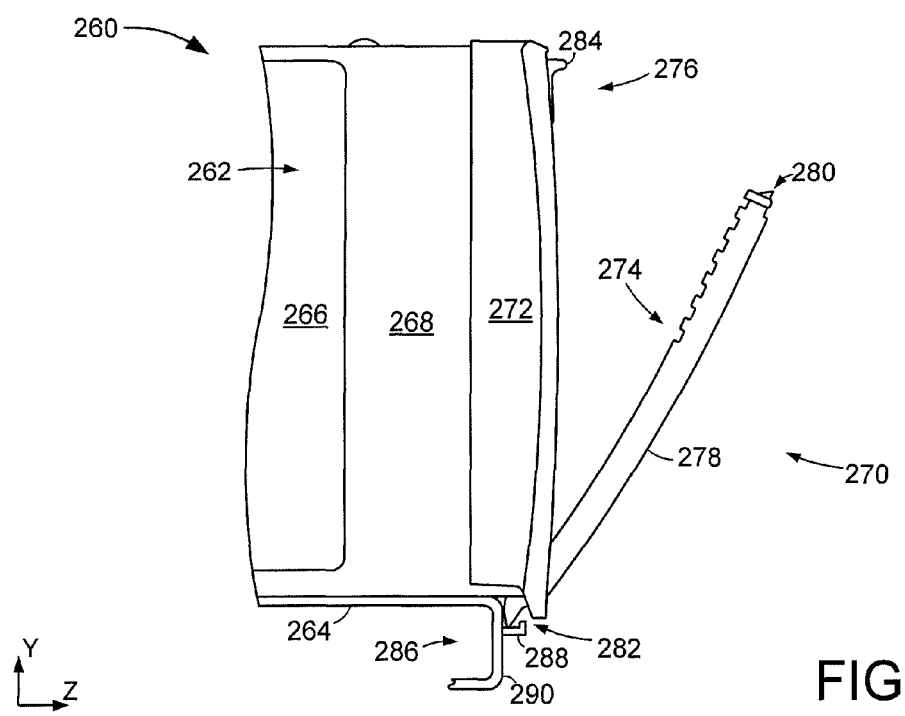
Figure 7D:
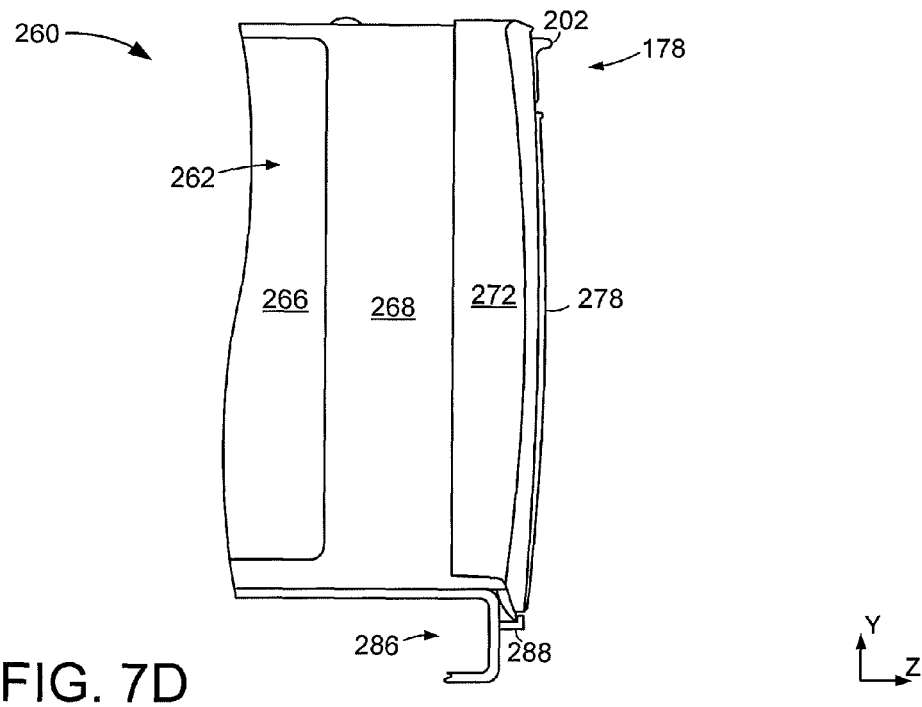

FIG. 7C shows how the cam protrusion 282 begins to leave contact with the strike surface 290 as the lever 278 is rotated. Such rotation can correspond with a tuned lateral sliding distance along the Z axis. In other words, the cam surface of the cam protrusion 282 can be tuned so that rotation of the lever 278 by 30° corresponds with an inch of lateral data storage enclosure 262 movement, for example. As illustrated in FIG. 7D, further rotation of the lever 278 will result in the retention tab 280 engaging the button 284 of the securing feature 276. The movement of the lever 278 also results in the cam protrusion 282 engaging the retention protrusion 288.

The concurrent contact of the retention protrusion 288 and strike surface 290 with the cam protrusion 282 can secure the data storage enclosure 262 in place in relation to the data storage rack 264. The relationship of the cam protrusion 282 with the retention feature 286 can correspond with physical contact and electrical connections between the data storage enclosure 262 and portions of the data storage rack 264, such as a midplane. Hence, rotation of the lever 278 can initiate, establish, disengage physical contact and electrical connections between at least two buses. It is contemplated that the shape and size of the cam protrusion 282 can mitigate any excessive force applied to the data storage enclosure 262 along the Z axis to reliably and safely connect rack 264 and enclosure 262 buses.

Figure 8:
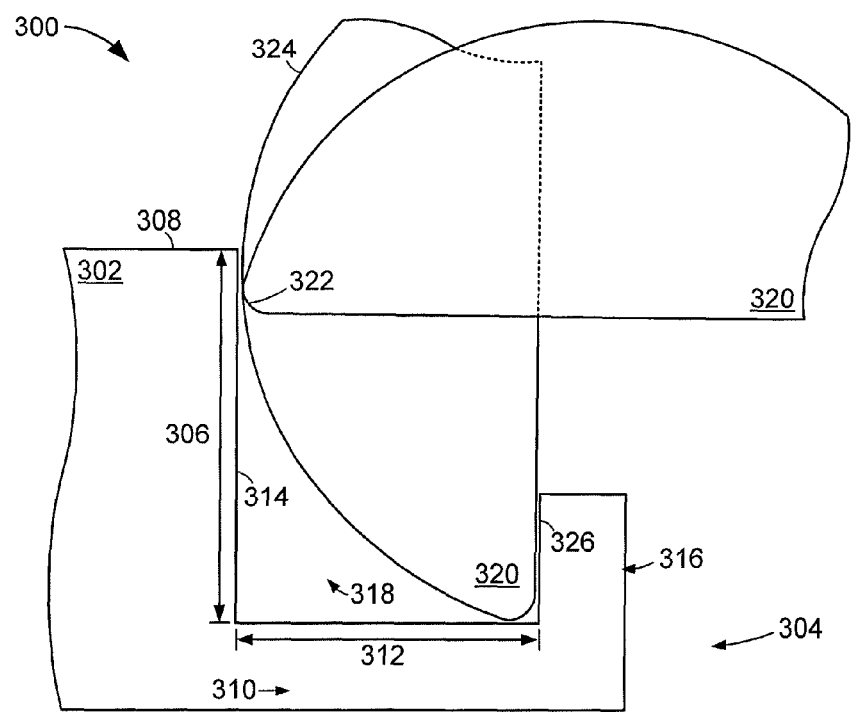
FIG. 8 displays a side view block representation of a portion of an example data storage system constructed and operated in accordance with some embodiments.

FIG. 8 is a side view block representation of a portion of an example data storage system 300 configured in accordance with various embodiments. A data storage rack frame 302 is shown with a retention protrusion 304 that is positioned an offset distance 306 from an enclosure surface 308 that faces a data storage enclosure. The retention protrusion 304 has a cantilevered plate 310 that extends a length 312 from a strike surface 314 along the Z axis before turning and continuously extending along the Y axis with a backplate 316. Although the shape of the plate 310 and backplate 316 are rectilinear, such configuration is not required and protrusion 304 can be tuned to be any shape and size, such as continuously curvilinear.

The tuned shape and size of the retention protrusion 304 defines a retention region 318 in which a cam protrusion 320 can contact, rotate, and be secured. As shown, the cam protrusion 320 can initially contact the strike surface 314 with a cam tip 322 before the lever attached to the cam protrusion 320 is rotated so that the curvilinear cam surface 324 slides and the cam tip 322 moves to contact a back surface 326 of the retention region 318. The continuously curvilinear shape of the cam surface 324 can efficiently translate rotational movement of the lever and cam protrusion 320 with lateral movement of the attached data storage enclosure. The tuned shape of the retention protrusion 304, retention region 318, and cam protrusion 320 can correspond with optimized data storage enclosure installation and removal through the articulation of a lever of the latch feature.

For instance, rotation of the lever can engage or disengage electrical connections between the data storage enclosure and rack depending on the direction of lever rotation. The tuned retention and latch features can optimize the efficiency and reliability of data storage enclosure installation and removal by mitigating any excess lateral force applied along the Z axis. It is contemplated that the contact between the cam protrusion 320 and rack frame 302 can pass any unwanted lateral force and vibration to the rack frame 302 instead of to the electrical interconnections of the data storage enclosure. The tuned configuration of the cam protrusion 320 and retention region 318 may securely retain the data storage enclosure during times of light, moderate, and severe rack and enclosure vibration, which can optimize data storage device performance.

Figure 9:
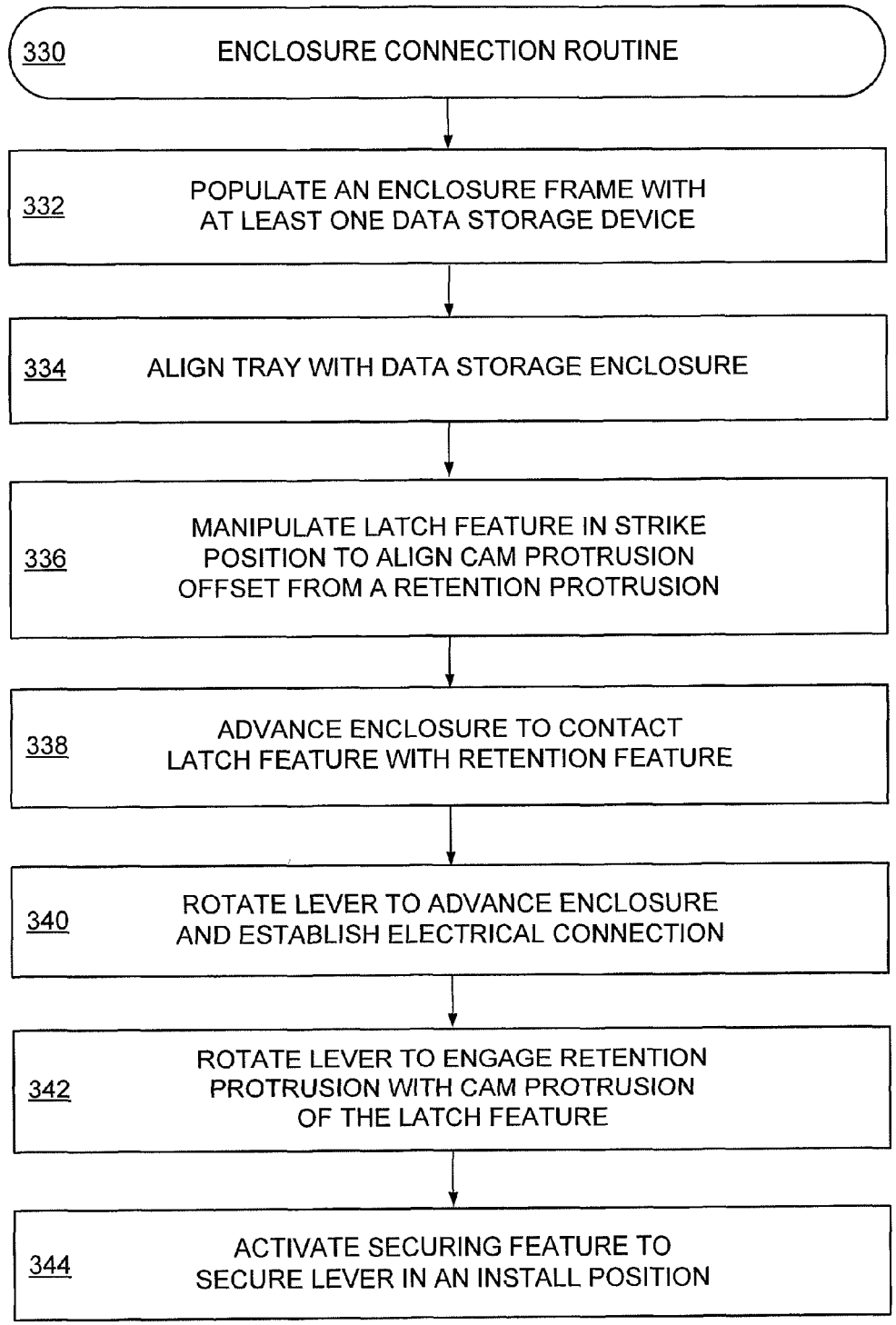
FIG. 9 illustrates an example enclosure connection routine that may be carried out in accordance with various embodiments.

Although a data storage enclosure may be installed and removed from a data storage rack in a diverse variety of manners, none of which are required, various embodiments utilize at least a latch feature in the example enclosure connection routine 330 shown in FIG. 9. As mentioned above, excessive force applied to a data storage enclosure during installation and removal from a data storage rack can damage electrical connectors and jeopardize the performance of the enclosure and data storage system as a whole. Hence, it is noted that at least a latch feature can be incorporated into the data storage enclosure of routine 330.

Routine 330 may begin by populating an enclosure frame with at least one data storage device in step 332. The population of step 332 may involve numerous different or similarly configured data storage devices on and within a frame that may define some, or all of the data storage enclosure. Step 332 may further involve assembling various portions of the data storage enclosure, such as electrically interconnecting the various data storage devices with one or more enclosure buses. With the data storage enclosure assembled and ready for installation into the data storage rack, step 334 can align the data storage enclosure with one or more slots of the data storage rack. The alignment may be facilitated by rollers, protrusions, bearings, sliders, and magnets that position the electrical bus or busses of the data storage enclosure with corresponding buses of the data storage rack, such as a midplane bus, connector, or pin.

The alignment of the enclosure and rack electrical connecting means allows the data storage enclosure to be advanced into the data storage rack, either robotically or manually. Step 336 positions a lever of the latch feature of the data storage enclosure in a strike position that corresponds with a cam protrusion being offset from a retention protrusion of the data storage rack frame and aligned with a strike surface of the data storage rack frame. Next, step 338 advances the data storage enclosure into the data storage rack until the cam protrusion of the latch feature contacts the strike surface. In accordance with some embodiments, the cam protrusion contacts the strike surface before any electrical connectors or buses physically or electrically contact.

The positive stop provided by the contact of the cam protrusion with the strike surface ensures any physical force applied to the data storage enclosure during step 338 is mitigated until step 340 rotates the lever of the latch feature to allow the data storage enclosure to advance into the data storage rack to form physical contact between the enclosure and rack electrical connector means. Step 342 proceeds to rotate the lever of the latch feature so that the cam protrusion engages the retention protrusion of the data storage rack frame to force the data storage enclosure into an installed position within the data storage rack where the rack and enclosure electrical connector means are securely interconnected.

The translation of the latch feature lever to an installed position can correspond with step 344 securing the lever in place by activating a securing feature to physically capture the lever. The securing feature may be manually or automatically operated to maintain the lever in place and ensure stable and secure electrical connection between the data storage rack and the data storage enclosure. While the various steps of routine 330 can be carried out to install the data storage enclosure, portions of the routine 330 can be conducted in reverse order to partially or completely remove the data storage enclosure from the data storage rack. For example, the securing feature may be selected in step 344 before steps 342 and 340 rotate the lever of the latch feature to disengage the electrical connector means of the enclosure from the data storage rack prior to step 338 removing the data storage enclosure.

It can be appreciated that through the tuned configuration and operation of a latch feature, excess physical force applied to a data storage enclosure can be mitigated. The ability to tune a positive stop for installing a data storage enclosure into a data storage rack can allow electrical interconnections to be safely and reliably formed. Additionally, the latch feature can be configured to securely install and maintain the data storage enclosure in the data storage rack through the latch feature's interaction with a retention feature of the data storage rack frame. The ability to manipulate the latch feature to ensure safe and secure electrical interconnection between an enclosure and a data storage rack optimizes data storage rack performance as trauma and damage to various electrical interconnections is reduced.

It is to be understood that even though numerous characteristics and configurations of various embodiments of the present disclosure have been set forth in the foregoing description, together with details of the structure and function of various embodiments, this detailed description is illustrative only, and changes may be made in detail, especially in matters of structure and arrangements of parts within the principles of the technology to the full extent indicated by the broad general meaning of the terms in which the appended claims are expressed. For example, the particular elements may vary depending on the particular application without departing from the spirit and scope of the present disclosure.

What is claimed is:

1. An apparatus comprising an enclosure housing at least two data storage devices, the enclosure comprising a first electrical connector and a latch feature, the first electrical connector aligned with a second electrical connector of a server rack, the latch feature comprising a lever and cam pivoting around a hinge, the cam contacting a strike surface of a retention feature of the server rack to prevent the first and second electrical connectors from contacting when the lever is in a first position, the cam shaped to continuously contact the strike surface while the lever is rotated from the first position to the second position to secure the first electrical connector to the second electrical connector, the cam concurrently contacting the strike surface and a back surface of the retention feature in the second position.

2. The apparatus of claim 1, wherein the server rack comprises a plurality of separate enclosures physically and electrically interconnected.

3. The apparatus of claim 1, wherein the hinge is attached to a frame of the enclosure.

4. The apparatus of claim 3, wherein the cam is a protrusion positioned on a first end of the lever and a retention tab is positioned on an opposite second end of the lever.

5. The apparatus of claim 4, wherein the cam comprises a continuously curvilinear surface extending from the lever to a tip.

6. The apparatus of claim 1, wherein the retention feature has with a retention protrusion extending perpendicularly from the strike surface to the back surface.

7. The apparatus of claim 1, wherein the strike surface and back surface are separated by a cantilevered plate extending parallel to the strike surface.

8. The apparatus of claim 1, wherein the at least two data storage devices are oriented differently with respect to each other within the enclosure.

9. The apparatus of claim 1, wherein the frame contacts a bottom side of the enclosure and alignment features are positioned on opposite lateral sides of the enclosure, the lateral sides being perpendicular to the bottom side.

10. The apparatus of claim 1, wherein a securing feature is positioned proximal the latch feature and selectively retains a portion of the latch feature when the latch feature is in an installed position.

11. An apparatus comprising an enclosure housing at least two electronic devices, the enclosure comprising a first electrical connector and a latch feature, the first electrical connector aligned with a second electrical connector of a rack, the latch feature comprising a lever and cam pivoting around a hinge, the cam contacting a strike surface of a retention feature of the rack to prevent the first and second electrical connectors from contacting while a lever of the latch feature is in a first position, the first and second electrical connectors secured in electrical contact in response to the lever being rotated to a second position where the cam shaped to concurrently contact the strike surface and a back surface of the retention feature in the second position, the strike surface is a part of a rack frame, the back surface separated from the rack frame and the strike surface by a cantilevered plate.

12. The apparatus of claim 11, wherein the cam continuously contacts the strike surface from the first position to the second position.

13. The apparatus of claim 11, wherein the second position corresponds with the cam concurrently contacting the strike surface, back surface, and a cantilevered plate that connects the strike and back surfaces.

14. The apparatus of claim 11, wherein the hinge is positioned below an enclosure body.

15. A method comprising:
    housing at least two data storage devices in an enclosure, the enclosure comprising a first electrical connector and a latch feature;
    aligning the first electrical connector with a second electrical connector of a data storage rack;
    contacting a cam of the latch feature with a strike surface of a retention feature of the data storage rack to prevent the first and second electrical connectors from contacting in response to a lever of the latch feature being in a first position; and
    moving the lever to a second position to rotate the cam about a hinge while the cam continuously contacts the strike surface, the cam shaped to continually contact the strike surface from the first position to the second position; the cam concurrently contacting the strike surface and a back surface of the retention feature in the second position, the second position securing the first electrical connector to the second electrical connector to establish electrical contact between the first and second electrical connectors.

16. The method of claim 15, wherein the latch feature provides a positive stop by contacting the strike surface of the frame.

17. The method of claim 16, wherein the cam comprises a cam surface that automatically rotates after contacting the strike surface.

18. The method of claim 15, wherein engagement of the latch feature with a retention protrusion of the frame advances the enclosure into the data storage rack.

19. The method of claim 15, wherein the moving step forms a secure electrical connection between an enclosure electrical bus and a rack electrical bus.

20. The method of claim 15, wherein the contacting step mitigates excess physical force applied to the second electrical connector.

* * * * *